United States Patent
Mohan et al.

(10) Patent No.: US 9,444,497 B1
(45) Date of Patent: Sep. 13, 2016

(54) METHOD AND APPARATUS FOR ADAPTIVELY TUNING AN INTEGRATED CIRCUIT

(75) Inventors: Sundararajarao Mohan, Sunnyvale, CA (US); Tim Tuan, San Jose, CA (US)

(73) Assignee: XILINX, INC., San Jose, CA (US)

( * ) Notice: Subject to any disclaimer, the term of this patent is extended or adjusted under 35 U.S.C. 154(b) by 1009 days.

(21) Appl. No.: 12/869,451

(22) Filed: Aug. 26, 2010

(51) Int. Cl.
*H03M 13/00* (2006.01)
*H03M 13/35* (2006.01)

(52) U.S. Cl.
CPC .................................. *H03M 13/35* (2013.01)

(58) Field of Classification Search
USPC .................................................. 714/775, 798
See application file for complete search history.

(56) References Cited

U.S. PATENT DOCUMENTS

| | | | |
|---|---|---|---|
| 8,191,029 B2* | 5/2012 | Tetelbaum et al. | 716/136 |
| 2010/0223520 A1* | 9/2010 | Henzler et al. | 714/744 |
| 2011/0004813 A1* | 1/2011 | Chandra | 714/798 |
| 2011/0187433 A1* | 8/2011 | Baumann et al. | 327/276 |
| 2011/0302460 A1* | 12/2011 | Idgunji et al. | 714/55 |

OTHER PUBLICATIONS

Ernst et al., Razor: Circuit-Level Correction of Timing Errors for Low-Power Operation. 2004, IEEE, pp. 10-20.*
Ernst, Dan et al., "Razor: Circuit-Level Correction of Timing Errors for Low-Power Operation", Micro, IEEE, , IEEE Computer Society, Nov.-Dec. 2004, pp. 10-20, vol. 24, Issue 6.

* cited by examiner

*Primary Examiner* — M. Mujtaba K Chaudry
(74) *Attorney, Agent, or Firm* — Kin-Wah Tong; Gerald Chan (57) ABSTRACT

A method and apparatus for adaptively tuning an integrated circuit are disclosed. For example, an integrated circuit (IC) comprises a monitored path comprising circuit elements operating on a clock signal, where a last circuit element of the circuit elements comprises a first flip flop. The IC also comprises a second flip flop operating on an early clock signal, where the early clock signal is phase shifted from the clock signal, and where the second flip flop is coupled to the monitored path prior to the last circuit element. The IC also comprises a transition detection module for detecting when an output from the first flip flop toggles, and an error prediction module to detect a potential error on the monitored path. The IC comprises a controller that is configured to scale a voltage or a frequency of the IC.

20 Claims, 5 Drawing Sheets

METHOD AND APPARATUS FOR ADAPTIVELY TUNING AN INTEGRATED CIRCUIT

FIELD OF THE INVENTION

An embodiment of the invention relates generally to a method and apparatus for adaptively tuning an integrated circuit (IC) such as, e.g., a programmable logic device (PLD).

BACKGROUND OF THE INVENTION

Reducing power consumption in an integrated circuit is often desirable. However designers of integrated circuits often select a conservative supply voltage to ensure correct operation of the integrated circuits under all possible variations. This conservative approach often means that there is a substantial margin that is added to the critical voltage to account for uncertainty in the circuit models and to address potential worst-case combination of variabilities. However such combination of variabilities might be very rare or unlikely to even occur in certain implementations. Thus, such conservative approach is excessively conservative and is implemented at the expense of consuming more power that is actually necessary to ensure the proper operation of an integrated circuit.

SUMMARY OF THE INVENTION

In one embodiment, a method and apparatus for adaptively tuning an integrated circuit are disclosed. For example, an integrated circuit comprises at least one monitored path comprising a plurality of circuit elements operating on a clock signal, wherein a last circuit element of the plurality of circuit elements comprises a first flip flop. The integrated circuit also comprises a second flip flop either: (a) operating on an early clock signal that is phase shifted from the clock signal, or (b) coupled via a delay to the at least one monitored path, wherein the second flip flop is coupled to the at least one monitored path prior to the last circuit element. The integrated circuit also comprises a transition detection module coupled to the at least one monitored path for detecting when an output from the first flip flop toggles, and an error prediction module coupled to the second flip flop to detect a potential error on the at least one monitored path. The integrated circuit comprises a controller coupled to the transition detection module and the error prediction module, wherein the controller is configured to scale a voltage or a frequency of the integrated circuit.

According to another embodiment, an integrated circuit comprises at least one monitored path comprising a plurality of circuit elements operating on a clock signal, a first flip flop operating on the clock signal, wherein the first flip flop is coupled to the at least one monitored path at a point prior to a last circuit element of the plurality of circuit elements, and a second flip flop operating on an early clock signal, wherein the early clock signal is phase shifted from the clock signal, wherein the second flip flop is coupled to the at least one monitored path at the point prior to the last circuit element. The integrated circuit also comprises a transition detection module coupled to the at least one monitored path for detecting when the output from the first flip flop toggles, an error prediction module coupled to the second flip flop to detect a potential error on the at least one monitored path, and a controller coupled to the transition detection module and the error prediction module, wherein the controller is configured to scale a voltage or a frequency of the integrated circuit.

According to another embodiment, a method of adaptively tuning an integrated circuit is provided. For example, the method includes: monitoring at least one monitored path comprising a plurality of circuit elements operating on a clock signal, determining whether a flip flop has latched an incorrect value from the at least one monitored path, wherein the flip flop is operating on an early clock signal, wherein the early clock signal is phase shifted from the clock signal, determining whether the flip flop has latched a correct value from the at least one monitored path and whether the at least one monitored path has toggled, and scaling a voltage or a frequency of the integrated circuit up if the flip flop has latched the incorrect value, or scaling a voltage or a frequency of the integrated circuit down if the flip flop has latched the correct value and the at least one monitored path has toggled.

BRIEF DESCRIPTION OF THE DRAWINGS

Accompanying drawings show exemplary embodiments in accordance with one or more aspects of the invention; however, the accompanying drawings should not be taken to limit the invention to the embodiments shown, but are for explanation and understanding only.

DETAILED DESCRIPTION OF THE DRAWINGS

In one embodiment, the present disclosure relates generally to a method and apparatus for performing adaptive tuning of an integrated circuit, e.g., a programmable logic device (PLD). For example, the present disclosure can be implemented within an integrated circuit, e.g., a programmable logic device (PLD), to adaptively tune or scale the supply voltage, the clock frequency, and/or the bias voltage.

In one embodiment, the IC that can be tuned with the present disclosure is a programmable logic device. Although the present disclosure is described in the context of a PLD, it should be noted that one or more aspects of the present disclosure relate generally to an integrated circuit (IC) and is not limited to a PLD. Namely, the designs or architectures of any type of ICs can be tuned by the present disclosure.

More specifically, in one embodiment, one or more aspects of the present disclosure relate generally to a programmable logic device. A programmable logic device (PLD) is a general-purpose device that can be programmed by a user to implement a variety of selected functions. One type of PLD is a Field Programmable Gate Array (FPGA), which typically includes an array of configurable logic blocks (CLBs) and a plurality of input/output blocks (IOBs). The CLBs are individually programmable and can be configured to perform a variety of logic functions on a few input signals. The IOBs can be configured to drive output signals from the CLBs to external pins of the FPGA and/or to receive input signals from the external FPGA pins. The FPGA also includes a programmable interconnect structure that can be programmed to selectively route signals among the various CLBs and IOBs to produce more complex functions of many input signals. The CLBs, IOBs, and the programmable interconnect structure are programmed by loading configuration data into associated memory cells that control various switches and multiplexers within the CLBs, IOBs, and the interconnect structure to implement logic and routing functions specified by the configuration data to implement a user design in the FPGA. An FPGA may also include other programmable and non-programmable resources.

In one embodiment, the present disclosure is used to tune or scale the supply voltage, the clock frequency, and/or the bias voltage of a FPGA. In brief, the present disclosure employs an error predictor or prediction module and a transition detector or detection module to implement voltage scaling and/or frequency scaling while ensuring the proper operation of the FPGA. Namely, the present disclosure is able to adaptively tune or scale the supply voltage, the clock frequency, and/or the bias voltage of the FPGA down to a level that is just above a point where errors may potentially occur. It should be noted that one aspect of the present disclosure is that the scaling is implemented in a manner that errors should not occur due to the adaptive scaling. Thus, this novel approach ensures the expected performance of the integrated circuit while adaptively minimizing the power consumption of the integrated circuit. One advantage of the present disclosure is that in one embodiment the tuning circuitry is deployed within the integrated circuit. As such, the integrated circuit can be adaptively tuned in response to operational conditions, i.e., the integrated circuit is tuned in view of actual variabilities experienced by the integrated circuit while deployed in the field.

Furthermore, although the present disclosure is described below in the context of scaling a supply voltage to the integrated circuit, the present disclosure is not so limited. Namely, the present disclosure can adaptively tune or scale the supply voltage, the clock frequency, the bias voltage, and any combination thereof. Furthermore, for clarity reasons, although the present disclosure is described in the context of a single critical path or a single critical time in an integrated circuit, it should be noted that an integrated circuit may in fact have a plurality of critical paths or a plurality critical timing constraints that need to be maintained. As such, although a plurality of critical paths is not shown below, the present disclosure can be adapted to address a plurality of critical paths.

Figure 1:
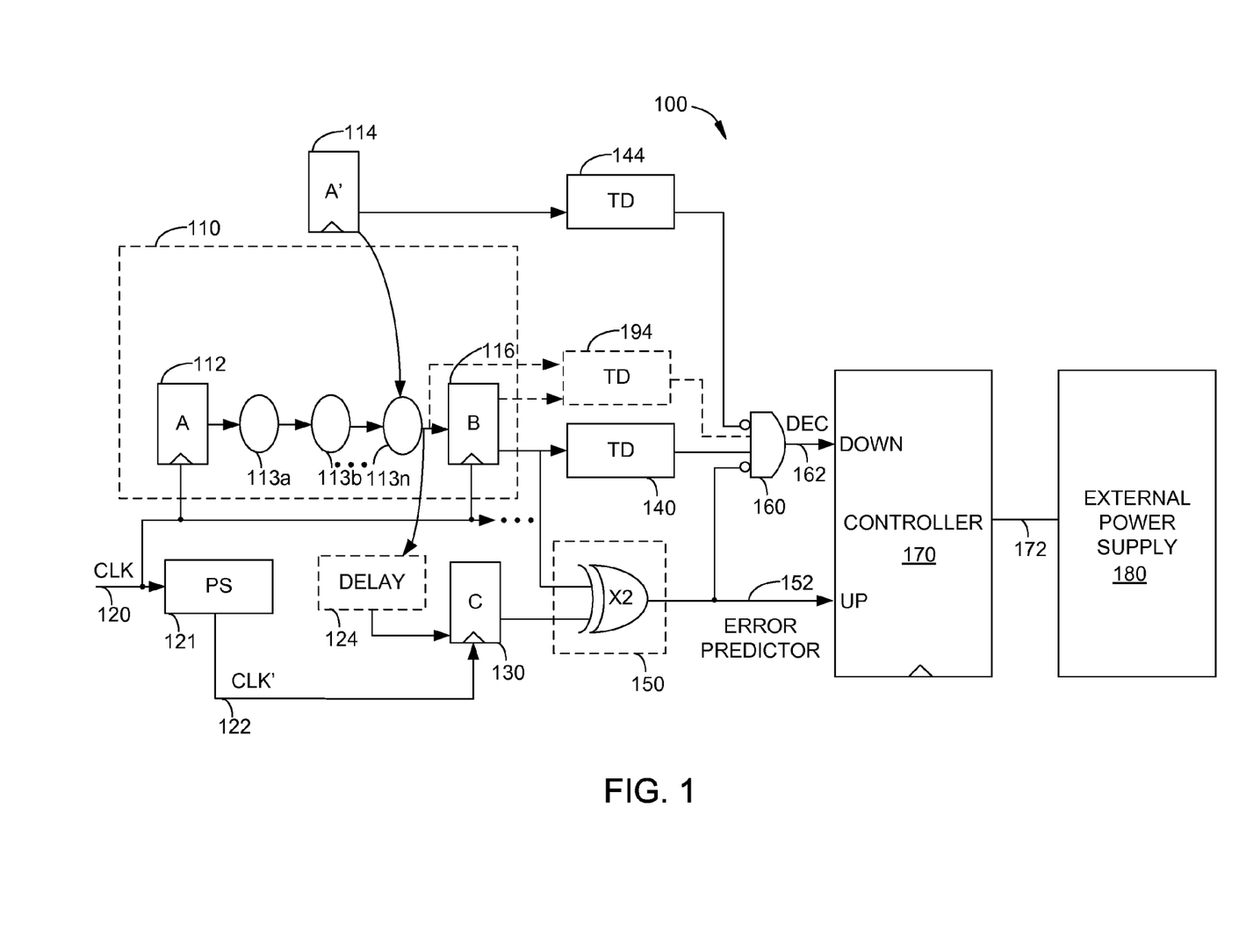
FIG. 1 illustrates a block diagram of a circuit implementation.

FIG. 1 illustrates a block diagram of a circuit implementation 100 according to an embodiment of the present disclosure. In one embodiment, the present disclosure enables dynamic tuning of the power consumption of an FPGA (e.g., via voltage scaling and/or frequency scaling) while ensuring that a critical path is operating correctly. In brief, this is accomplished by introducing additional circuitry that comprises a phased shifted earlier clock (broadly an early clock signal) that is used to monitor the critical path(s) to detect when the integrated circuit is approaching a potential failure, i.e., before the failure actually occurs. Once the potential failure is detected, the present disclosure is able to dynamically take corrective measures such as increasing the supply voltage or frequency.

FIG. 1 illustrates a critical path 110. Broadly defined, a critical path is a circuit path that has a timing delay close to the maximum allowed delay for any circuit path. In one illustrative example, the critical path 110 is shown as having a flip flop A 112 as providing a critical input to a plurality of circuit elements 113a-n before reaching another flip flop B 116 (broadly a last circuit element of the critical path). The critical path 110 uses the clock signal 120. It should be noted that although the clock signal (CLK) is used by other components of the integrated circuit, it is not shown in other parts of FIG. 1 to simplify the figure to improve clarity.

In FIG. 1, the critical path(s) such as path 110, of an integrated circuit is initially determined. The determination as to which paths in an integrated circuit are "critical paths" is application specific. In other words, the designers of an integrated circuit are aware of such critical paths in their design or alternatively, testing programs can be employed to analyze a circuit design and critical paths can be identified by the testing program. The present disclosure is not limited as to the manner in which a path is identified as a critical path.

Once a critical path is identified, additional circuitry will be deployed. In one embodiment, a shadow flip flop C 130 is deployed to receive the same input as flip flop B 116 deployed at the end of the critical path. However, unlike flip flop B 116, the shadow flip flop C 130 is operating under a phased shifted earlier clock (CLK') 122. In one embodiment, a phase shifter (PS) 121 receives the clock signal (CLK) 120 and provides a phased shifted earlier clock that is approximately 10%-20% earlier than the clock signal (CLK). It should be noted that the degree of "earliness" is application specific. Namely, as will be described below, the degree of "earliness" is a function of a margin of error that will be acceptable in scaling down the voltage or frequency. In one embodiment, the phased shifted earlier clock (CLK') is set to be a number of look-up table delays, e.g., two (2) look-up table delays. It should be noted that the present disclosure is not limited to any particular degree of earliness as long as no error will occur based solely on the scaling down of the voltage or frequency. The phase shifter can be implemented using circuit modules present in modern FPGAs and ICs, such as a mixed mode clock manager (MMCM), phase lock loop (PLL) or a digital clock management (DCM) module.

Furthermore, in one alternate embodiment, instead of using a phase shifted clock, the same effect can be achieved by adding additional delay 124 on the data input to the shadow flip-flop C 130. In this alternate embodiment, the same clock can be used for all flip flops without the need for the phase shifter 121.

In one embodiment, the shadow flip flop C 130 using the phased shifted earlier clock (CLK') is able to latch a value that is destined to the flip flop B 116 deployed at the end of the critical path. However, the shadow flip flop C 130 is able to latch the value slightly ahead of the flip flop B 116.

In one embodiment, the outputs of the shadow flip flop C 130 and the flip flop B 116 are provided to an error predictor module 150. For example, the error predictor module 150 is used to determine whether there is a difference between the two outputs. If there is a difference between the two outputs, the error predictor module 150 will provide an error predictor signal 152 indicating a potential error will occur. It should be noted that the error predictor signal 152 does not indicate the occurrence of an error, but instead, provides a prediction that a potential error may occur soon. The reason could be that the previous scaling down of the voltage and/or frequency (or simply the variabilities of the current operating environment) has caused the integrated circuit to now operate too close to the acceptable margin of the critical path such that an error is imminent. If such condition exists, the error predictor module 150 will provide the error predictor signal 152 to the controller 170.

In one embodiment, the error predictor module 150 is implemented as an exclusive OR gate X2. However, it should be noted that the error predictor module 150 can be implemented using any other circuitry as long as the error predictor module 150 is able to determine that the critical path is operating within the margin of acceptable performance.

Figure 3:
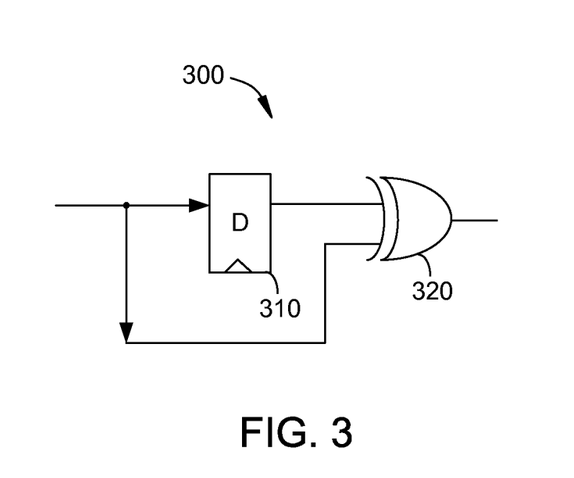
FIG. 3 illustrates a block diagram of a transition detection module.

In one embodiment, the output of the flip flop B 116 is provided to a transition detection module (TD) 140. The transition detection module (TD) 140 is tasked with detecting when the output of the critical path toggles, e.g., when the output of flip flop B 116 toggles. One reason is that the present disclosure limits the scaling of the voltage and/or frequency only after the critical path has toggled. In one embodiment, the transition detection module (TD) 140 is implemented using a flip flop 310 and an exclusive OR gate 320 as shown in FIG. 3. Again, it should be noted that the transition detection module (TD) 140 can be implemented using any other circuitry as long as the transition detection module (TD) 140 is able to determine that the output of the critical path has toggled.

In one embodiment, the output of the transition detection module (TD) 140 and the error predictor module 150 are provided to an AND gate 160. For example, when the critical path has toggled and the error predictor signal 152 is low, then AND gate 160 will provide a DEC signal 162 indicating that the voltage and/or frequency can be decreased. The DEC signal 162 is provided to controller 170. In one embodiment, the AND gate 160 can be broadly interpreted as being part of the controller 170.

In one embodiment, the controller 170 is able to use the states of the DEC signal 162 and error predictor signal 152 to determine whether to decrease or to increase the voltage or frequency. For example, if the controller 170 determines from the error predictor signal 152 that the integrated circuit is operating within the margin of acceptable performance of the critical path, the controller 170 may elect to adjust the supply voltage, the clock frequency, and/or the bias voltage to ensure that no error will occur on the critical path. Similarly, if the controller 170 determines from the DEC signal 162 that the integrated circuit is not operating within the margin of acceptable performance of the critical path and the output of the critical path has just toggled, the controller 170 may elect to adjust the supply voltage, the clock frequency, and/or the bias voltage to reduce power consumption by the integrated circuit. In turn, the controller 170 will output a control signal 172 to scale the voltage or frequency accordingly. In one embodiment, the control signal 172 is provided to an external power supply 180. However, it should be noted that in general the control signal 172 can be provided to any circuitry that is capable of scaling the supply voltage, the clock frequency, and/or the bias voltage of an integrated circuit. It should be noted that voltage and frequency are modified in opposite directions. In other words, if there is a condition where the voltage is increased (in cases where it is desirable to control the voltage), the frequency would be decreased, and vice versa.

It should be noted that the controller 170, e.g., a voltage controller, can be implemented using a counter and/or a state machine. In one embodiment, in order to reduce the sensitivity of the present disclosure, the controller may elect to analyze a sequence of input signals or a window of input signals before generating the control signal 172.

To illustrate, in one embodiment the controller 170 may not immediately scale up or down the voltage or frequency based upon one instance of the DEC signal 162 or error predictor signal 152. For example, the controller 170 may perform an averaging function over a number of received signals (e.g., a number of received signals over a predefined period of time) before generating the control signal 172. Alternatively, the controller 170 may wait for a number of consecutively received signals (broadly referred to as a consecutive function) of the same state before generating the control signal 172, e.g., receiving ten (10) consecutive DEC signals 162 before scaling down the voltage or frequency.

In yet another alternative embodiment, the controller 170 may be more sensitive to the error predictor signal 152 than the DEC signal 162. For example, the controller 170 may immediately scale up the voltage or frequency based upon a single high error predictor signal 152, whereas it will wait for several consecutive DEC signals 162 before scaling down the voltage or frequency. This approach ensures that no error will be generated on the critical path, while maintaining a less aggressive power reduction scheme.

FIG. 1 also illustrates an alternate embodiment in which the critical path 110 may receive a non-critical input. For example, a flip flop A' 114 may provide a non-critical input into the component 113n that is in the critical path. This non-critical input can also be monitored in one embodiment of the present disclosure. As illustrated, a transition detection module 144 is employed to determine when the output of the flip flop A' 114 toggles. In this alternate embodiment, the AND gate 160 will only provide a high DEC signal 162 when the critical path has toggled, the error predictor signal 152 is low, and the output of the flip flop A' 114 has not toggled. This approach ensures that the transition in flip flop B is caused by the critical path and not from input received from a non-critical path, e.g., from flip-flop A'. In this alternate approach, a corresponding transition detection module will be employed for each of the non-critical inputs.

Figure 4:
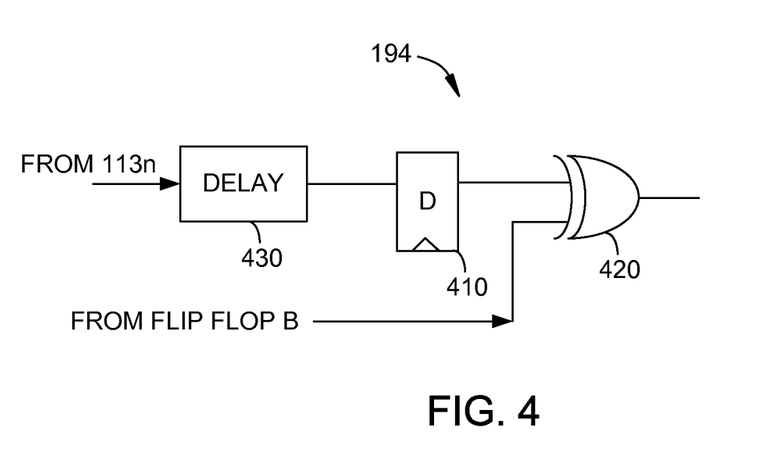
FIG. 4 illustrates a block diagram of an alternate embodiment of a transition detection module.

FIG. 4 illustrates a block diagram of an alternate embodiment of a transition detection module 194. It should be noted that transition detection module 194 is also shown in FIG. 1 (in dashed lines) as an alternate embodiment. Unlike the transition detection modules 140 and 144, the transition detection module 194 is wired differently in that the transition detection module 194 receives one input from flip flop B and another input from a circuit element 113n (that is deployed just before flip flop B) as shown in FIG. 1. Unlike the embodiment as discussed above that uses a corresponding transition detection module for each of the non-critical inputs, this alternate embodiment only requires a single transition detection module 194 irrespective of the number of number of non-critical inputs. As shown in FIG. 4, the transition detection module 194 employs a delay 430 before a flip flop D 410 and an exclusive OR gate 420. In operation, the flip flop D 410 will be able to detect the transition of flip flop B due to a critical input (e.g., from flip flop A 112) versus from a non-critical input (e.g., from flip flop A' 114). This ability is derived from the delay being selected to match approximately a difference (plus a small margin) between the time between A-to-B and the time between A'-to-B. In other words, the delay is selected such that a transition caused by the critical input A 112 will be detectable by the transition detection module 194 (i.e., detectable in the sense that flip flop D latches a different value from that of flip flop B), whereas a transition caused by the non-critical input A' 114 will be ignored by the transition detection module 194 (i.e., ignored in the sense that flip flop D latches a same value from that of flip flop B due to the delay). In this manner, only a single transition detection module 194 is required even if there are multiple non-critical inputs as long as the delay is properly selected.

Figure 2:
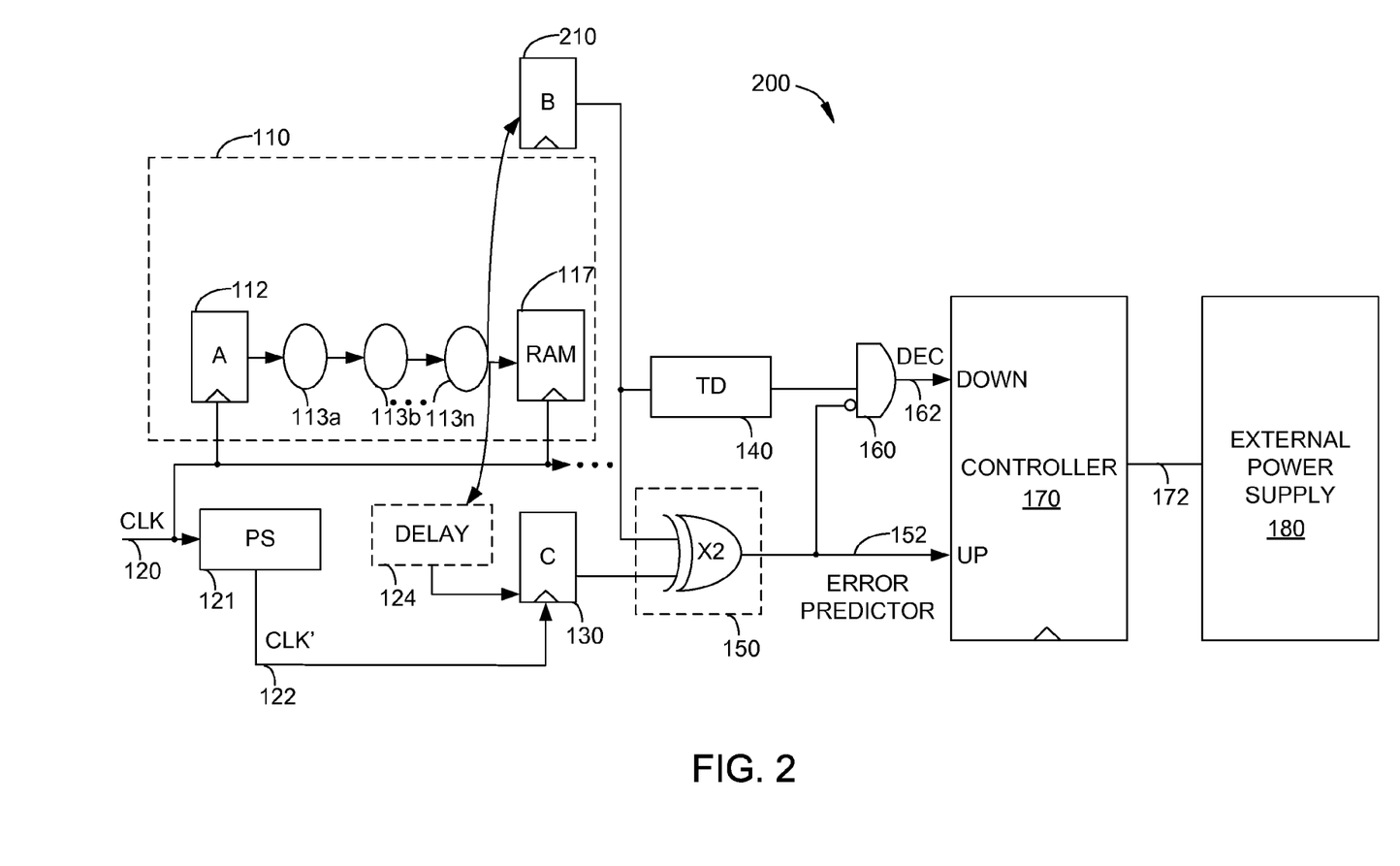
FIG. 2 illustrates a block diagram of an alternate circuit implementation.

FIG. 2 illustrates a block diagram of an alternate circuit implementation 200 according to an embodiment of the present disclosure. FIG. 2 is similar to FIG. 1 with the exception that the critical path does not end on a flip flop. For example, in this illustration, the critical path ends in a circuit element such as a random access memory (RAM). To address this scenario, a capture flip flop B 210 is employed to latch the output from a circuit element just prior to the end of the critical path. In turn, the output of the capture flip flop B 210 is treated the same way as flip flop B 116 in FIG. 1. Except for this one distinction, FIG. 2 is similar to FIG. 1. As such, the operation of FIG. 2 is similar to FIG. 1 and the reader is encouraged to refer above for the operation of the circuit illustrated in FIG. 2.

It should be noted that the present disclosure is described above in the context of a single monitored path, e.g., a single critical path. However, an integrated circuit may have a plurality of monitored paths, e.g., a plurality of critical paths. As such, each monitored path may have a corresponding set of circuit elements as described in FIGS. 1 and 2, i.e., each critical path is monitored by its own controller. Alternatively, each monitored path may have a corresponding set of circuit elements that provides their outputs to a common controller.

Figure 5:
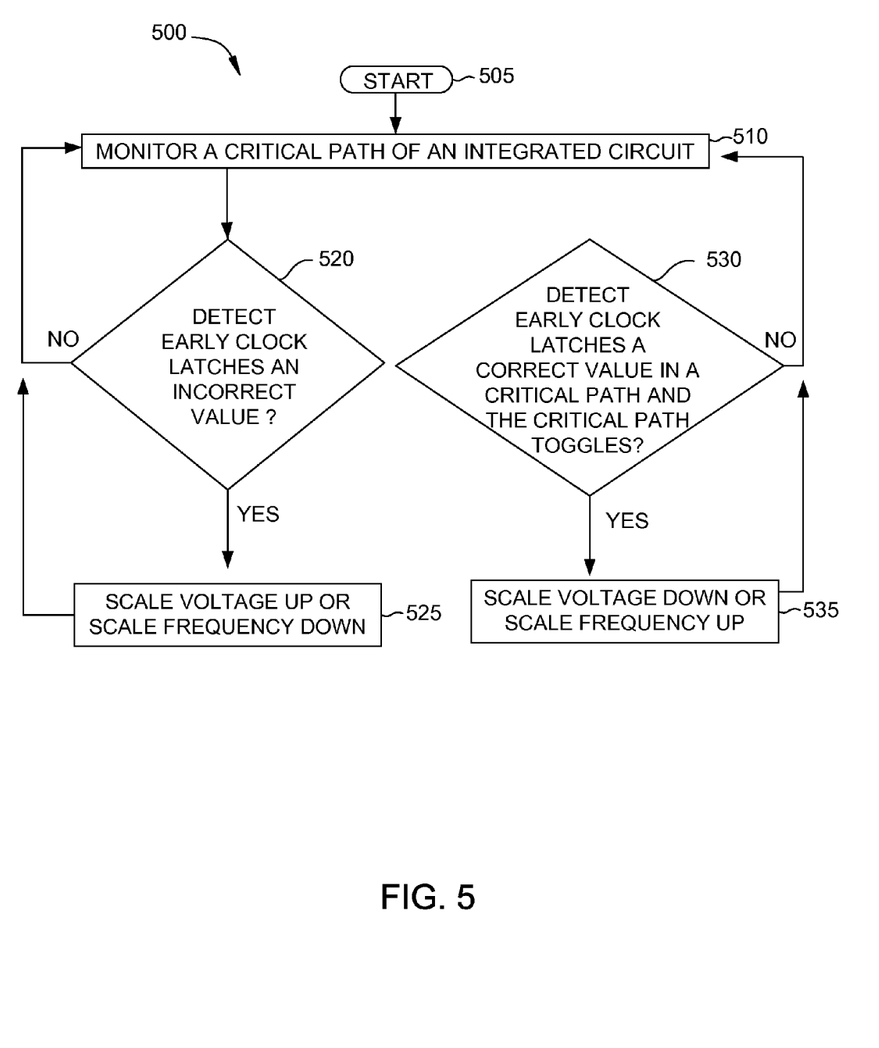
FIG. 5 illustrates a block diagram of a method for performing adaptive tuning of an integrated circuit.

FIG. 5 illustrates a block diagram of a method 500 for performing adaptive tuning of an integrated circuit. For example, method 500 can be performed by a circuitry as illustrated above deployed in an integrated circuit, e.g., a FPGA. The method starts in step 505 and proceeds to step 510.

In step 510, the method monitors one or more monitored paths (e.g., critical paths) of an integrated circuit. For example, the method monitors when the output of a critical path (or broadly a monitored path comprising a plurality of circuit elements) toggles, and monitors the values captured by a latch that operates under an early clock signal relative to an integrated circuit clock used by the critical path.

In step 520, the method determines whether a latch operating under an early clock signal relative to an integrated circuit clock used by the critical path latches an incorrect value in the critical path. If the query is answered negatively, the method returns to step 510. If the query is answered positively, the method proceeds to step 525.

In step 525, the method scales up or increases the voltage or scales down or decreases the frequency. For example, the method increases the supply voltage, and/or the bias voltage to ensure that no error will occur on the critical path. Method 500 then returns to step 510.

In step 530, the method determines whether a latch operating under an early clock signal relative to an integrated circuit clock used by the critical path latches a correct value in the critical path and the critical path has toggled. If the query is answered negatively, the method returns to step 510. If the query is answered positively, the method proceeds to step 535.

In step 535, the method scales down or decreases the voltage or scales up or increases the frequency. For example, the method decreases the supply voltage, and/or the bias voltage to reduce power consumption by the integrated circuit. Method 500 then returns to step 510.

As noted above, the steps 520 and 530 may optionally employ an averaging function (e.g., averaging the received signals over a predefined period of time) or a consecutive function (e.g., only give weights to states of a plurality of consecutive signal) before the method 500 will proceed to step 525 and step 535, respectively.

It should be noted that although not specifically specified, one or more steps of method 500 may include a storing, displaying and/or outputting step as required for a particular application. In other words, any data, records, fields, tables, and/or intermediate results discussed in the method can be stored, displayed and/or outputted to another device as required for a particular application. Furthermore, steps or blocks in FIG. 5 that recite a determining operation or involve a decision, do not necessarily require that both branches of the determining operation be practiced. In other words, one of the branches of the determining operation can be deemed as an optional step.

Figure 6:
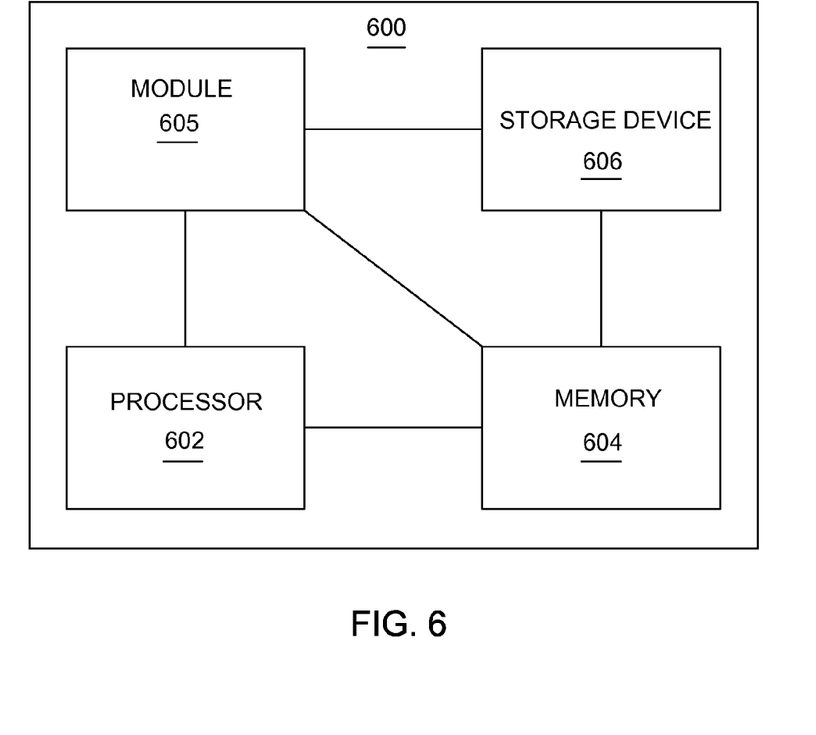
FIG. 6 illustrates a high level block diagram of a general purpose computer or a computing device suitable for use in performing the functions described herein.

FIG. 6 depicts a high level block diagram of a general purpose computer, a computing device, or a computing system 600 suitable for use in performing some or all of the functions described herein. As depicted in FIG. 6, the system 600 comprises a processor element 602 (e.g., a CPU), a memory 604, e.g., a random access memory (RAM) and/or a read only memory (ROM), a module 605 for adaptively tuning an integrated circuit IC), and various input/output devices 606 (e.g., storage devices, including but not limited to, a memory device, a tape drive, a floppy drive, a hard disk drive or a compact disk drive, a receiver, a transmitter, a speaker, a display, a speech synthesizer, an output port, and a user input device (such as a keyboard, a keypad, a mouse, and the like)).

One or more embodiments of the present invention can be implemented in a combination of software and hardware, e.g., using application specific integrated circuits (ASIC), a PLD such as a FPGA, a general purpose computer or any other hardware equivalents such as microprocessors. In one embodiment, the present module or process for adaptively tuning an integrated circuit (IC) can be loaded into memory 604 and executed by processor 602 to implement the functions as discussed above. As such, the present module or process 605 for adaptively tuning an integrated circuit (IC) (including associated data structures) of one or more embodiments of the present invention can be stored on a non-transitory computer readable storage medium, e.g., RAM memory, magnetic or optical drive or diskette and the like.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

What is claimed is:

1. An integrated circuit comprising:
   at least one monitored path comprising a plurality of circuit elements operating on a clock signal, wherein a last circuit element of said plurality of circuit elements comprises a first flip flop;
   a second flip flop either: (a) operating on an early clock signal that is phase shifted from said clock signal, or (b) coupled via a delay to said at least one monitored path, wherein said second flip flop is coupled to said at least one monitored path at a point prior to said last circuit element;
   a transition detection module coupled to said at least one monitored path for detecting when an output from said first flip flop toggles;

an error prediction module coupled to said second flip flop to predict a potential error on said at least one monitored path; and a controller coupled to said transition detection module and said error prediction module, wherein said controller is configured to adaptively scale a voltage or a frequency of said integrated circuit based on an output of the transition detection module and an output of the error prediction module, to prevent the potential error from occurring on said at least one monitored path.

2. The integrated circuit of claim 1, wherein said at least one monitored path comprises at least one critical path.

3. The integrated circuit of claim 2, wherein said transition detection module is further coupled to the point prior to said last circuit element.

4. The integrated circuit of claim 1, wherein said frequency comprises a clock frequency.

5. The integrated circuit of claim 1, wherein the controller scales down said voltage or said frequency of said integrated circuit when said error prediction module detects said potential error on said at least one monitored path.

6. The integrated circuit of claim 5, wherein said controller scales down said voltage or said frequency of said integrated circuit in accordance with an averaging function.

7. The integrated circuit of claim 5, wherein said controller scales down said voltage or said frequency of said integrated circuit in accordance with a consecutive function.

8. The integrated circuit of claim 1, wherein said controller scales up said voltage or said frequency of said integrated circuit when said error prediction module does not detect said potential error on said at least one monitored path and said transition detection module detects said output from said first flip flop has toggled.

9. The integrated circuit of claim 8, wherein said controller scales up said voltage or said frequency of said integrated circuit in accordance with an averaging function.

10. The integrated circuit of claim 8, wherein said controller scales up said voltage or said frequency of said integrated circuit in accordance with a consecutive function.

11. The integrated circuit of claim 1, wherein said transition detection module comprises a third flip flop coupled to an exclusive OR gate.

12. The integrated circuit of claim 1, wherein said error prediction module comprises an exclusive OR gate.

13. The integrated circuit of claim 1, wherein said at least one monitored path receives at least one non-critical input.

14. The integrated circuit of claim 13, wherein said at least one non-critical input is provided by a fourth flip flop.

15. The integrated circuit of claim 14, further comprising:
a second transition detection module coupled to said fourth flip flop for detecting when an output from said fourth flip flop toggles.

16. The integrated circuit of claim 1, wherein the second flip flop is capable of latching an incorrect value from the at least one monitored path.

17. An integrated circuit comprising:
at least one monitored path comprising a plurality of circuit elements operating on a clock signal;
a first flip flop operating on the clock signal, wherein said first flip flop is coupled to said at least one monitored path at a point prior to a last circuit element of said plurality of circuit elements;
a second flip flop operating on an early clock signal, wherein said early clock signal is phase shifted from said clock signal, wherein said second flip flop is coupled to said at least one monitored path at said point prior to said last circuit element;
a transition detection module coupled to said at least one monitored path for detecting when said output from said first flip flop toggles;
an error prediction module coupled to said second flip flop to predict a potential error on said at least one monitored path; and
a controller coupled to said transition detection module and said error prediction module, wherein said controller is configured to adaptively scale a voltage or a frequency of said integrated circuit based on an output of the transition detection module and an output of the error prediction module, to prevent the potential error from occurring on said at least one monitored path.

18. The integrated circuit of claim 17, wherein the second flip flop is capable of latching an incorrect value from the at least one monitored path.

19. A method of adaptively tuning an integrated circuit, comprising:
monitoring at least one monitored path comprising a plurality of circuit elements operating on a clock signal;
determining whether a flip flop coupled to said at least one monitored path has latched an incorrect value from said at least one monitored path to predict a potential error on said at least one monitored path, wherein said flip flop is operating on an early clock signal, wherein said early clock signal is phase shifted from said clock signal;
determining whether said flip flop has latched a correct value from said at least one monitored path and whether said at least one monitored path has toggled; and
scaling a voltage or a frequency of said integrated circuit up if said flip flop has latched the incorrect value, or scaling a voltage or a frequency of said integrated circuit down if said flip flop has latched the correct value and said at least one monitored path has toggled, to prevent the potential error from occurring on said at least one monitored path.

20. The method of claim 19, wherein said at least one monitored path comprises at least one critical path.

* * * * *